(12) United States Patent
Meyer et al.

(10) Patent No.: US 8,058,643 B2
(45) Date of Patent: Nov. 15, 2011

(54) ELECTROCHEMICAL MEMORY WITH INTERNAL BOUNDARY

(75) Inventors: Rene Meyer, Palo Alto, CA (US); Paul C. McIntyre, Sunnyvale, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 1005 days.

(21) Appl. No.: 11/864,426

(22) Filed: Sep. 28, 2007

(65) Prior Publication Data

US 2008/0078985 A1    Apr. 3, 2008

Related U.S. Application Data

(60) Provisional application No. 60/848,421, filed on Sep. 29, 2006.

(51) Int. Cl.
    *H01L 31/0336* (2006.01)
(52) U.S. Cl. ........... 257/27; 365/148; 365/153; 365/163
(58) Field of Classification Search .................... 257/27; 365/148, 153, 163
    See application file for complete search history.

(56) References Cited

U.S. PATENT DOCUMENTS

| 5,896,312 | A | 4/1999 | Kozicki et al. |
| 5,914,893 | A | 6/1999 | Kozicki et al. |
| 6,084,796 | A | 7/2000 | Kozicki et al. |
| 6,815,744 | B1 | 11/2004 | Beck et al. |
| 7,274,035 | B2 * | 9/2007 | Yang et al. .................. 257/27 |
| 7,569,459 | B2 * | 8/2009 | Karg et al. .................... 438/385 |
| 2005/0185444 | A1 | 8/2005 | Yang et al. |
| 2006/0050598 | A1 | 3/2006 | Rinerson et al. |

FOREIGN PATENT DOCUMENTS

| WO | WO 00/49659 | 8/2000 |
| WO | WO 2006/029228 A2 | 3/2006 |

OTHER PUBLICATIONS

Meyer, et al. *Oxygen vacancy migration and time-dependent leakage current behavior in BST thin films*, Applied Physic Letters, 86, 112904 (2005).

Nian, et al., *Evidence for an Oxygen Diffusion Model for the Electric Pulse Induced Resistance Change Effect in Oxides*, arXiv:condmat/0602507 (2006).

Meyer, et al., *Nonlinear Electrical Properties of Grain Boundaries in Oxygen Ion Conductors: Modeling the varistor behavior*, Electrochemical and Solid State Letters, 8 (10) E67-E69 (2005).

Sawa, et al. *Hysteretic current-voltage characteristic and resistance switching at a rectifying Ti/PrCaMnO3 interface*, Applied Physics Letters, vol. 85, No. 18, 4073-75 (2004).

Zhuang, et al., *Novel colossal magnetoresistive thin film non-volatile resistance random access memory (RRAM)*, IEDM 193-196 (2002).

Baek, et al., *Highly scalable nonvolatile resistive memory using simple binary oxide driven by asymmetric unipolar voltage pulses*, IEDM Technical Digest. IEEE International Volume, Issue 13-15 (2004) pp. 587-590.

* cited by examiner

*Primary Examiner* — Samuel Gebremariam
(74) *Attorney, Agent, or Firm* — Crawford Maunu PLLC

(57) ABSTRACT

Non-volatile resistance change memories, systems, arrangements and associated methods are implemented in a variety of embodiments. According to one embodiment, a memory cell having two sections with outwardly-facing portions, the outwardly-facing portions electrically coupled to electrodes is implemented. The memory cell has an ionic barrier between the two sections. The two sections and the ionic barrier facilitate movement of ions from one of the two sections to the other of the two sections in response to a first voltage differential across the outwardly-facing portions. The two sections and the ionic barrier diminish movement of ions from the one of the two sections to the other of the two sections in response to another voltage differential across the outwardly-facing portions.

13 Claims, 9 Drawing Sheets

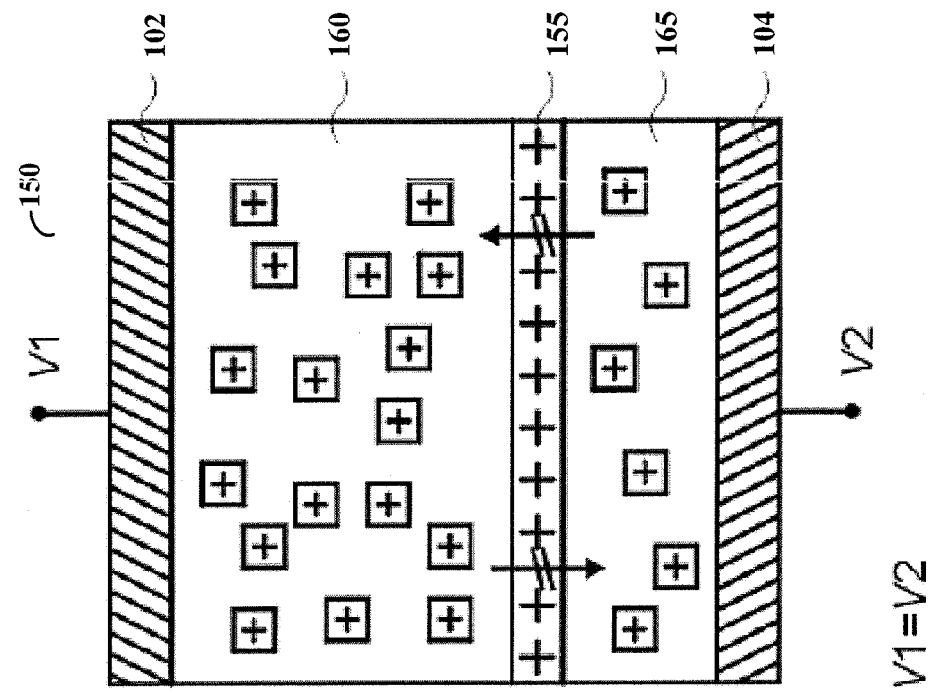
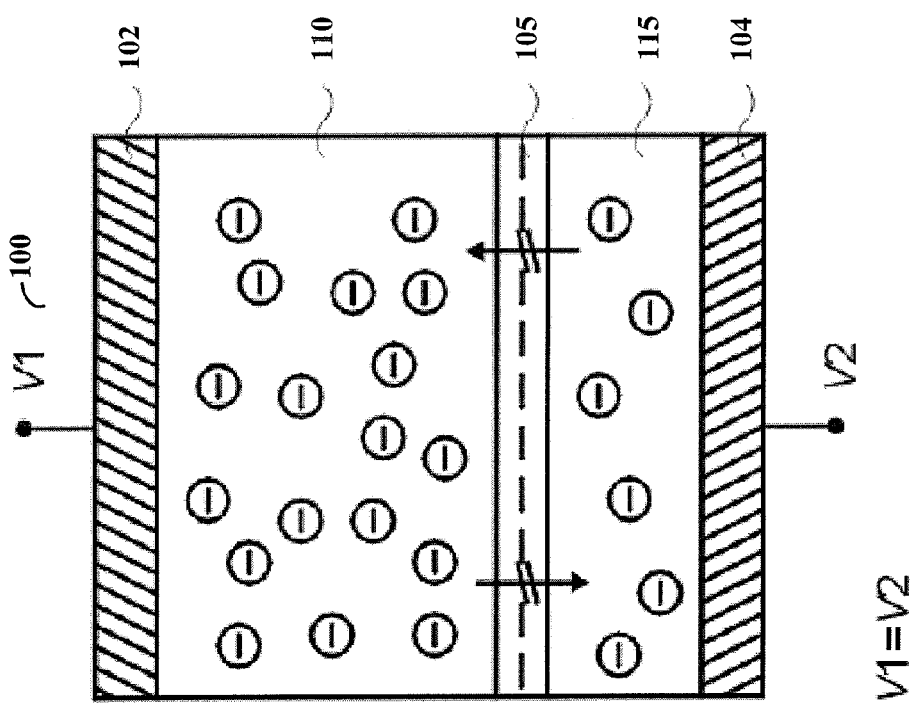
FIG. 1B
FIG. 1A

ELECTROCHEMICAL MEMORY WITH INTERNAL BOUNDARY

RELATED PATENT DOCUMENTS

This patent document claims the benefit, under 35 U.S.C. §119(e), of U.S. Provisional Patent Application No. 60/848,421 filed on Sep. 29, 2006 and entitled: "Electrochemical Memory With Internal Boundary," which is fully incorporated herein by reference.

FIELD OF THE INVENTION

The present invention relates generally to non-volatile resistance change memories and more particularly to a method and structure to improve resistance-change memories based upon solid state electrolytes.

BACKGROUND

Non-volatile memories are memories where the information is conserved even if the memory is disconnected from a power source. In resistance change memories, the information (logic "1" and logic "0") is stored as a "high" or a "low" resistance state of the memory cell. What non-volatile random access memories (NVRAM) have in common is that the information is programmed or erased in the power-on state, while the memory cell stores the information over a period of at least 10 years in the power-off state. Non-volatile resistance change memories address some of the issues of the ultra high density non-volatile memory market.

One type of non-volatile memory is FLASH memory. Prominent examples for FLASH applications are non-volatile memories in computers, cell phones, memory sticks, personal digital assistants (PDAs), digital cameras, smart cards, etc. Driven by the need to minimize production costs, the size of the memory cell has been continuously reduced. State of the art semiconductor devices are manufactured using the 65 nm technology (i.e., 65 nm denotes the size of the smallest feature of the manufactured structure). As a consequence of the continuous reduction of the memory cell size, the FLASH memory is expected to reach its physical scaling limit between the 45 nm and the 32 nm technology node.

A variety of resistance change memory concepts have been proposed to supersede FLASH. Resistance change memories can be categorized in phase change RAMs (PCRAM), resistive RAMs (RRAM) and electrochemical RAMs (ECRAM). Even though RRAM and ECRAM show some potential to become a successor of FLASH, the formation of a filament in the memory cell is essential for the memory operation. However, filamentary based memories do not scale well in relation to area or thickness. It remains therefore questionable, whether filamentary based memories can be commercialized. A disadvantage of PCRAM is the large current consumption of the memory during program/erase operations.

Some scalable non-volatile memories utilize a mixed electronic ionic conductor to store the information. Scalability of the memory cell is highly desired for memory applications. Mixed ionic electronic conductors are solids with a high mobility of ions or ion vacancies. The high mobility of ions/vacancies gives rise to ionic motion. At the same time, a sufficiently high concentration of electrons or defect electrons causes an electronic conduction. One of the properties of a mixed electronic ionic conductor is that a change in the ionic/vacancy concentration is correlated with a change in the concentration of electrons or electron holes. Thus, local changes in the electronic concentration affect the overall conductivity of the material. The mixed ionic electronic conductor will further be referred to as "solid state electrolyte". Since the memory mechanism is very similar for solid state electrolytes with ionic and ion vacancies conduction, the focus is on solid state electrolytes with vacancy conduction. Similar considerations can be applied to solid state electrolytes of predominantly ion conduction.

By applying an external electric field, vacancies are redistributed inside the solid state electrolyte. Thus, the memory effect is based on the local change of electronic charge carriers, which is a consequence of the redistribution of vacancies. A concentration change of electronic charge carriers causes an increase or decrease in the resistance of the memory cell.

To ensure fast program/erase times, solid state electrolytes with high ionic mobility have to be used. During the programming operation, a concentration gradient of ions builds up. After switching off the external field, the redistributed ions tend to move back to their initial (equilibrium) positions, thereby lowering the concentration gradient. A redistribution of ions, however, causes a loss of the stored information over time, which can lead to a loss of the data stored by the memory cell. As a consequence thereof, fast electrochemical memories are often unreliable.

The above issues as well as others have presented challenges to the manufacture and implementation of electrochemical memories for a variety of applications.

SUMMARY

The present invention is directed to overcoming the above-mentioned challenges and others related to the types of devices and applications discussed above and in other display, visualization and feedback applications. These and other aspects of the present invention are exemplified in a number of illustrated implementations and applications, some of which are shown in the figures and characterized in the claims section that follows.

According to one example embodiment, a memory cell having two sections with outwardly-facing portions, the outwardly-facing portions electrically coupled to electrodes is implemented. The memory cell has an ionic barrier between the two sections. The two sections and the ionic barrier facilitate movement of ions from one of the two sections to the other of the two sections in response to a first voltage differential across the outwardly-facing portions. The two sections and the ionic barrier diminish movement of ions from the one of the two sections to the other of the two sections in response to another voltage differential across the outwardly-facing portions.

According to another example embodiment, a memory element is implemented with a first ionic reservoir having majority of ions of a first polarity, a second ionic reservoir having majority of ions of the first polarity and an ionic barrier, located between the first and second ionic reservoirs, having a charge of the first polarity. The ionic barrier also diminishes movement of ions between the reservoirs and, in response to an absolute voltage differential across the barrier, facilitates movement of ions between the first and second ionic reservoirs.

According to another example embodiment, a memory element is implemented that includes first means for holding a majority of ions of a first polarity, second means for holding a majority of ions of the first polarity and barrier means, located between the first and second means. The barrier means having a charge of the first polarity and for controlling movement of ions between the first and second means in response to at least one voltage differential across the barrier The above summary is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings, in which:

FIG. 1A depicts a block diagram of an electrochemical memory cell, where ions are the majority charge carrier, according to an example embodiment of the present invention;

FIG. 1B depicts a block diagram of an electrochemical memory cell, where ion vacancies are the majority charge carrier, according to an example embodiment of the present invention;

FIG. 9A shows a Coulomb barrier, and FIGS. 9B and 9C show different versions of a dipole barrier, according to an example embodiment of the present invention.

Figure 2A:
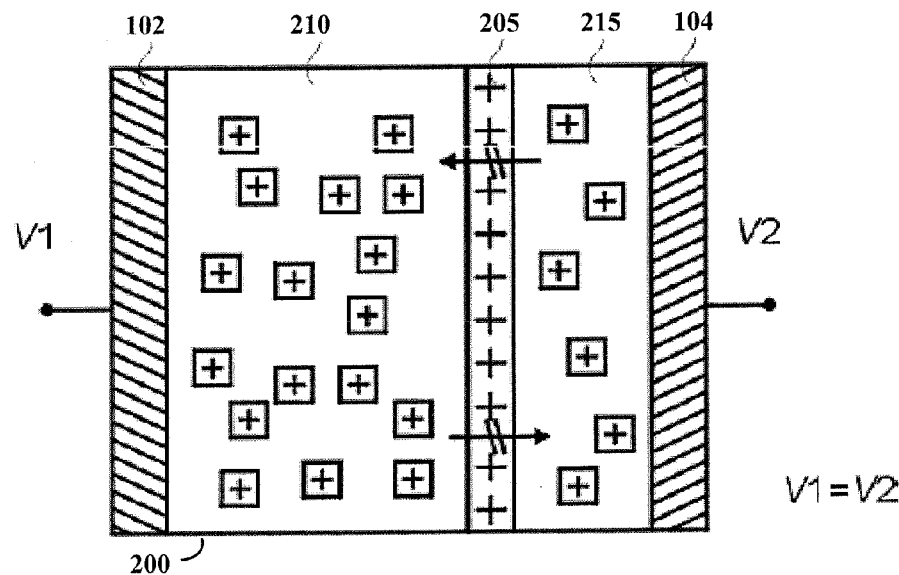
FIG. 2A depicts a block diagram of the memory cell of FIG. 1B, where the majority ionic defect type consists of oxygen vacancies, according to an example embodiment of the present invention.

While the invention is amenable to various modifications and alternative forms, various embodiments have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Various embodiments of the present invention are directed towards a non-volatile memory that prevents retention loss in electrochemical memories based on solid state electrolytes. The redistribution of mobile ions is prevented through the use of a voltage dependent internal potential barrier for ions/vacancies. The internal potential barrier separates two solid state electrolyte reservoirs. In the presence of an internal potential barrier, the exchange rate of ions/vacancies between the reservoirs operates as a function of the external voltage in a highly nonlinear manner. This is particularly useful for applications with solid state electrolytes having ion mobility. Due to the internal potential barrier, the motion of ions/vacancies and information loss over time is reduced. Fast programming/erase times can thus be combined with long term data retention.

In an example embodiment, the internal potential barrier is realized as an electrostatic potential barrier formed by an interfacial layer between the reservoir and the control layer of the same charge as the charge of mobile ions/vacancies in the ion reservoir. Interfacial layers of opposite charge can be realized by doping the thin layer or by taking advantage of charged trap states between the reservoir and the control layer formed either intentionally or intrinsically during the deposition process.

In another example embodiment, the internal potential barrier is realized as an electrostatic potential step formed by an interfacial dipole layer. A dipole layer between the reservoir and the control layer can be realized by using materials for the reservoir and control layer with different standard potentials of the mobile ionic/vacancy species. Depending on the operation of the particular memory, which could be either enrichment or depletion of ions in the control layer, it is reasonable to choose either the control layer or the reservoir as the material with the higher standard potential.

In another example embodiment, the internal potential barrier is realized as a heterojunction of two dissimilar materials.

In an additional example embodiment, the internal potential barrier can be realized through a combination of the previous example embodiments.

A variety of materials can be used for the reservoir for holding a majority of ions of a first polarity (e.g., the solid state electrolyte ion reservoir) and for the control layer for holding a majority of ions of the first polarity (e.g., the control layer), including but not limited to: Perovskites (Titanates, Manganates, Zirconates, etc.), binary oxides ($TiO_2$, $NiO_2$, etc.), sulfides (CdS), and other solid state electrolytes.

A barrier for controlling movement of ions between two reservoirs in response to at least one voltage differential across the barrier can be implemented using a number of structures including, but not limited to doping a section between the reservoirs, a heterojunction of dissimilar materials or a dipole layer.

In an example embodiment, FIG. 1A depicts an electrochemical memory cell 100 where ions are the majority charge carrier. An internal barrier for ions 105 separates the solid state electrolyte in a reservoir 110 and a control layer 115. The ion reservoir and control layer are chosen in a way that a variation of the ion concentration in the control layer causes a resistance change of the memory cell. The internal barrier suppresses an ion exchange between the reservoir and the control layer at low external voltages. FIG. 1B depicts an electrochemical memory cell 150 where ion vacancies are the majority charge carrier. An internal barrier 155 for ion vacancies separates the solid state electrolyte in a reservoir 160 and a control layer 165. The internal barrier suppresses an ion vacancy exchange between the reservoir and the control layer. The barrier height of the internal barrier can be altered by an external field. At small external fields, the large barrier is present. Under high electric fields (e.g., via electrodes 102 and 104), the effective barrier height is drastically reduced. Electrostatic barriers showing this behavior are described in R. Meyer, X. Guo, R. Waser, *Nonlinear Electrical Properties of Grain Boundaries in Oxygen Ion Conductors: Modeling the varistor behavior*, Electrochem. Solid State Lett. 8 E67-E69 (2005), which is fully incorporated herein by reference.

Figure 2B:
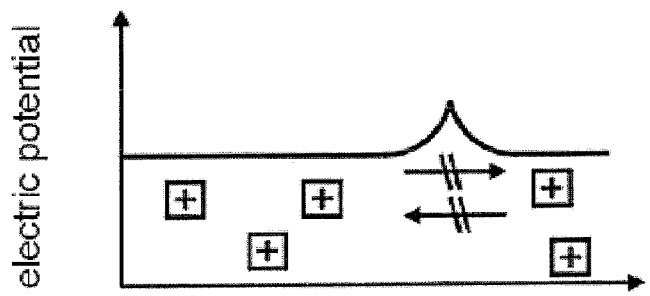
FIG. 2B depicts a sketch of the internal electric potential barrier, according to an example embodiment of the present invention.
Figure 2C:
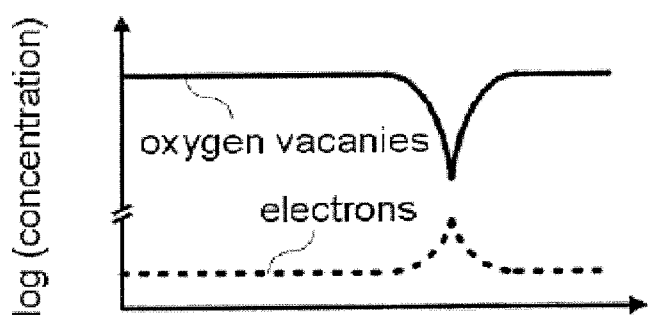
FIG. 2C depicts a sketch of the profiles of oxygen vacancies (ion vacancies) and electrons in the reservoir and the control layer, according to an example embodiment of the present invention.

FIG. 2A depicts the electrochemical memory cell 200 where the majority ionic defect type is oxygen vacancies and electronic conductivity is due to electrons. At small voltages (read operation) or under zero power condition (non-volatile memory operation), the internal barrier 205 hinders the exchange of ions between the ion reservoir 210 and the control layer 215. FIG. 2B shows a sketch of the internal electric potential barrier, and FIG. 2C shows the profiles of oxygen vacancies (ion vacancies) and electrons in the reservoir and the control layer.

Figures 3A, 3B:
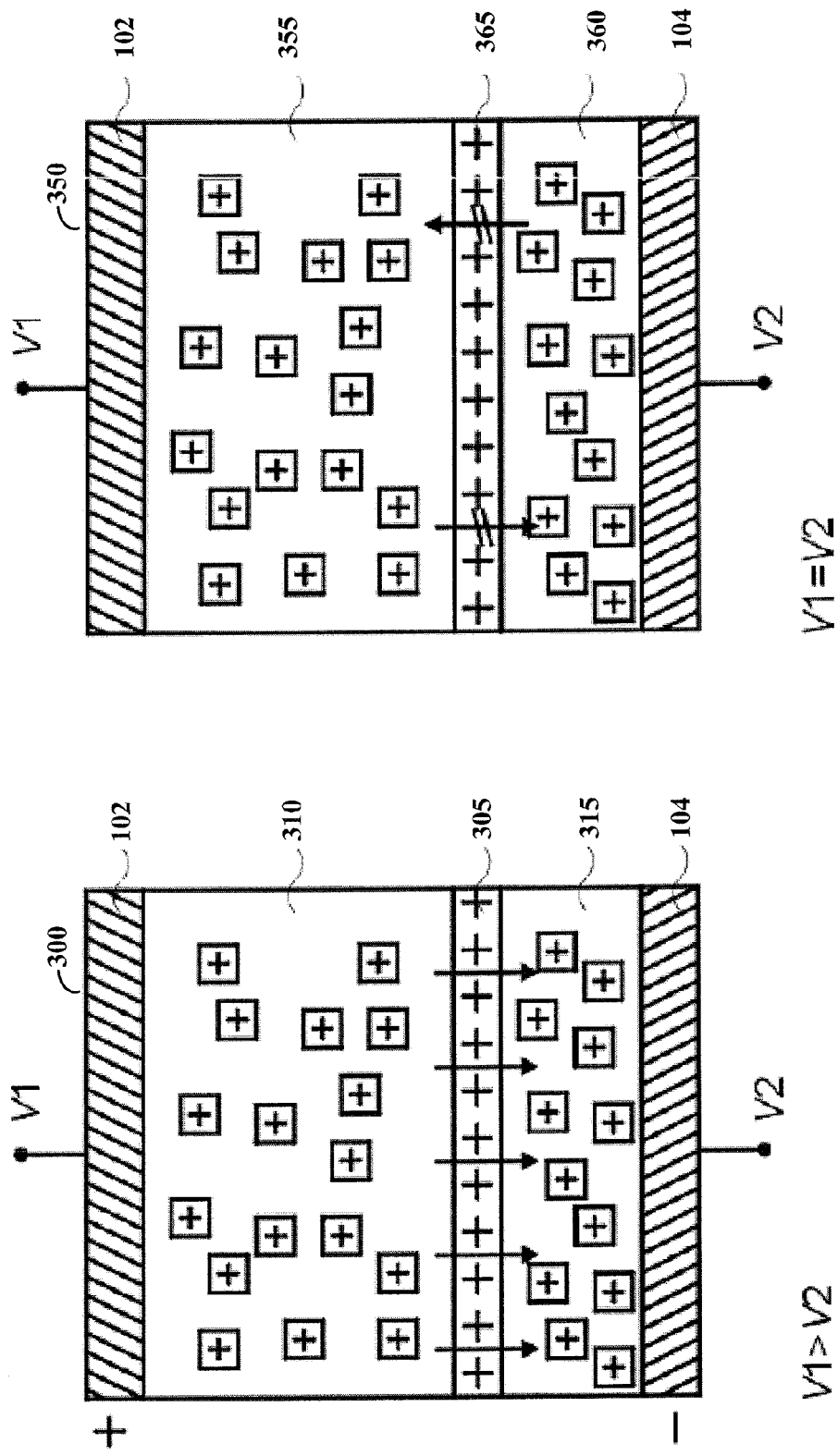
FIG. 3A depicts a block diagram of the memory cell described in FIG. 2B under voltage bias (program operation), according to an example embodiment of the present invention.
FIG. 3B depicts a block diagram of the memory cell described in FIG. 1B after programming at zero bias voltage (program operation), according to an example embodiment of the present invention.
Figures 4A, 4B:
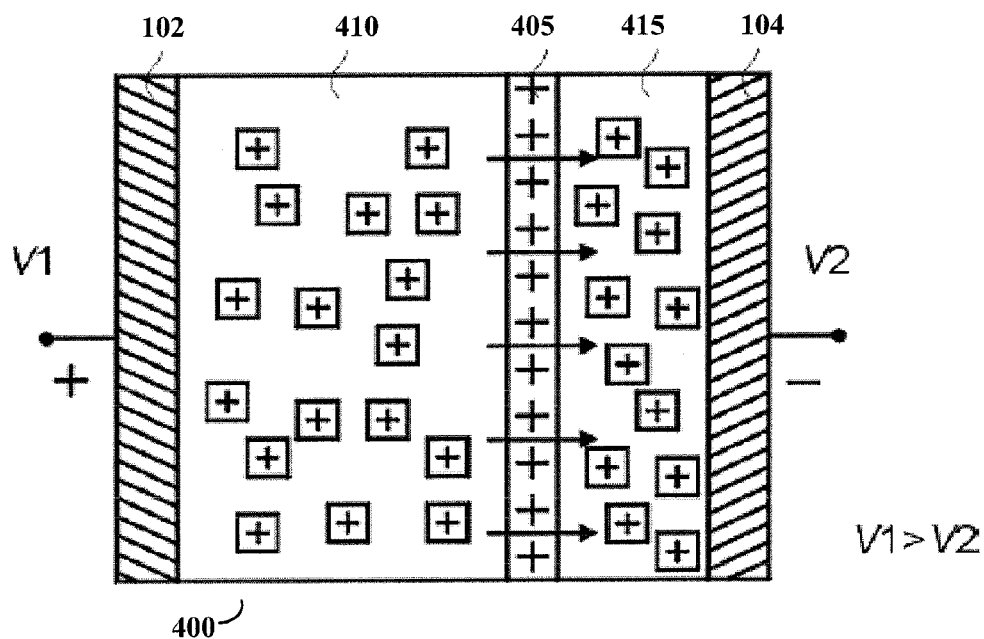
FIG. 4A depicts a block diagram of the memory cell of FIG. 3A, according to an example embodiment of the present invention.
FIG. 4B depicts a sketch of the inner electrical potential for the program operation, according to an example embodiment of the present invention.

In a specific implementation, FIG. 3A depicts a memory cell 300 as described in FIG. 1B under voltage bias (program operation). Due to the reduction of the internal barrier 305, ionic defects are exchanged between the reservoir 310 and the control layer 315. FIG. 3B depicts a memory cell 350 as described in FIG. 3A after programming at zero bias voltage (program operation). At zero voltage, ionic defects cannot be exchanged between the reservoir 355 and the control layer 360. After switching the external field, the internal barrier 365 recovers and the exchange of ions between the reservoir and the control layer is suppressed. In this state, logic "1" is stored in the memory cell. FIG. 4A depicts the memory cell 400 of FIG. 3A, where the majority ionic defect type is oxygen vacancy and electronic conductivity is due to electrons. At high voltages, the effective barrier 405 is reduced, so that ions can be exchanged between the ion reservoir 410 and the control layer 415. FIG. 4B shows the voltage induced reversible break-down of the internal barrier during the enrichment of ion vacancies in the control layer (program operation).

Figure 5B:
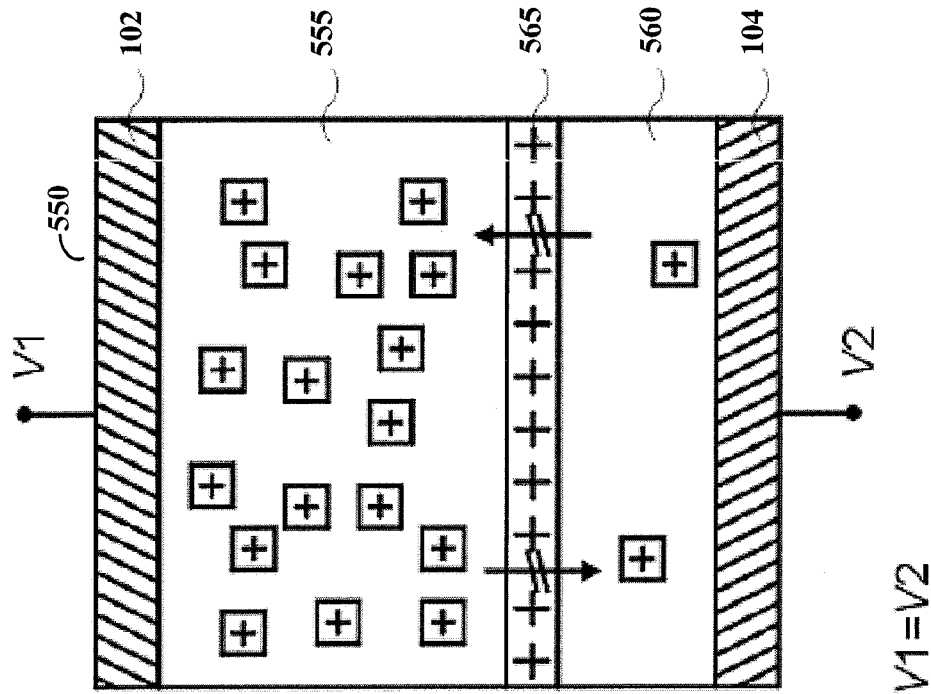
FIG. 5B depicts a block diagram of the memory cell described in FIG. 1B after programming at zero bias voltage (e.g., erase operation), according to an example embodiment of the present invention.
Figure 5A:
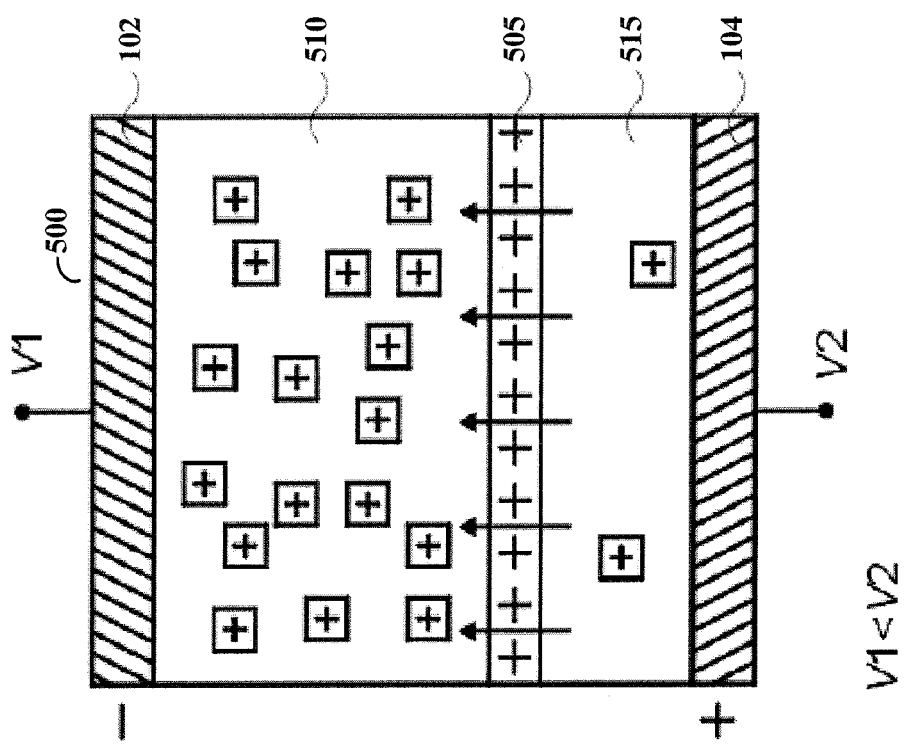
FIG. 5A depicts a block diagram of the memory cell described in FIG. 4B under reverse voltage bias (erase operation), according to an example embodiment of the present invention.
Figure 6A:
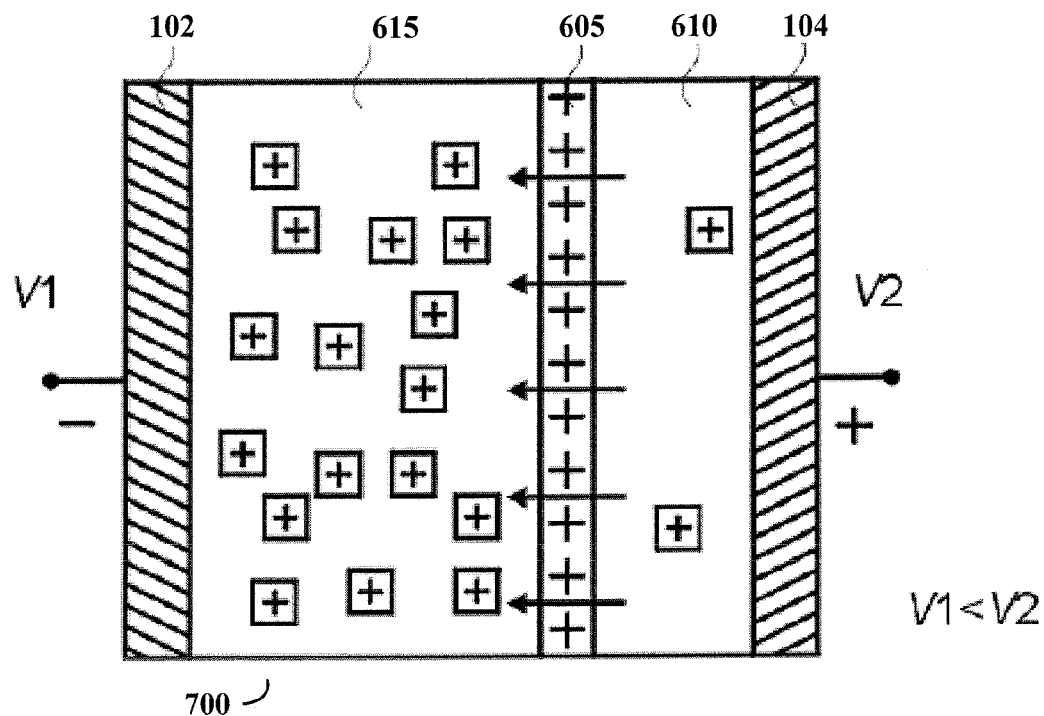
FIG. 6A depicts a block diagram of the memory cell of FIG. 5A, according to an example embodiment of the present invention.
Figure 6B:
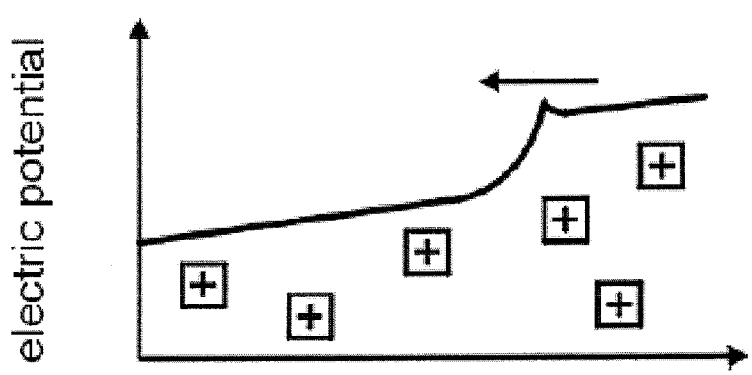
FIG. 6B depicts a sketch of the inner electric potential for the erase operation, according to an example embodiment of the present invention.

In another specific implementation, FIG. 5A depicts a memory cell 500 as described in FIG. 3B under reverse voltage bias (erase operation). Due to the reduction of the internal barrier 505, ionic defects are exchanged between the reservoir 510 and the control layer 515. FIG. 5B depicts a memory cell 550 as described in FIG. 5A after programming at zero bias voltage (program operation). At zero voltage, ionic defects cannot be exchanged between the reservoir 555 and the control layer 560. After switching the external field, the internal barrier 565 recovers and the ion exchange between the control layer and the reservoir is suppressed. In this state, logic "0" is stored in the memory cell. FIG. 6A depicts the memory cell 600 of FIG. 5A, where the majority ionic defect type is oxygen vacancy and electronic conductivity is due to electrons. At large voltages, the effective barrier 605 is reduced, so that ions can be exchanged between the control layer 610 and the ion reservoir 615. FIG. 6B shows the voltage induced reversible break-down of the internal barrier during the depletion of ion vacancies in the control layer (erase operation).

Figure 7B:
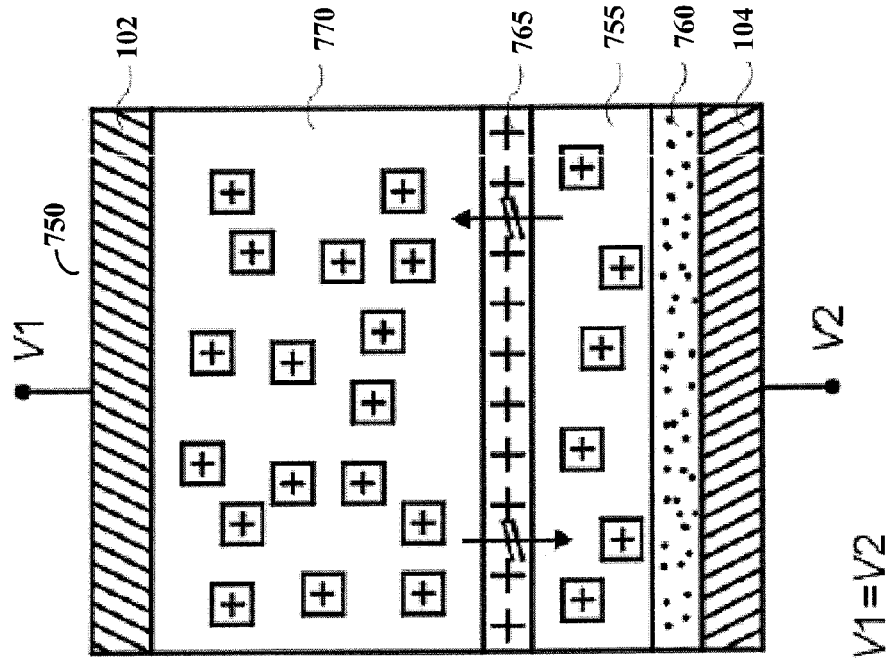
FIG. 7B depicts a block diagram of a different structure of an electrochemical memory cell, where the majority charge carrier in the reservoir are ion vacancies, according to an example embodiment of the present invention.
Figure 7A:
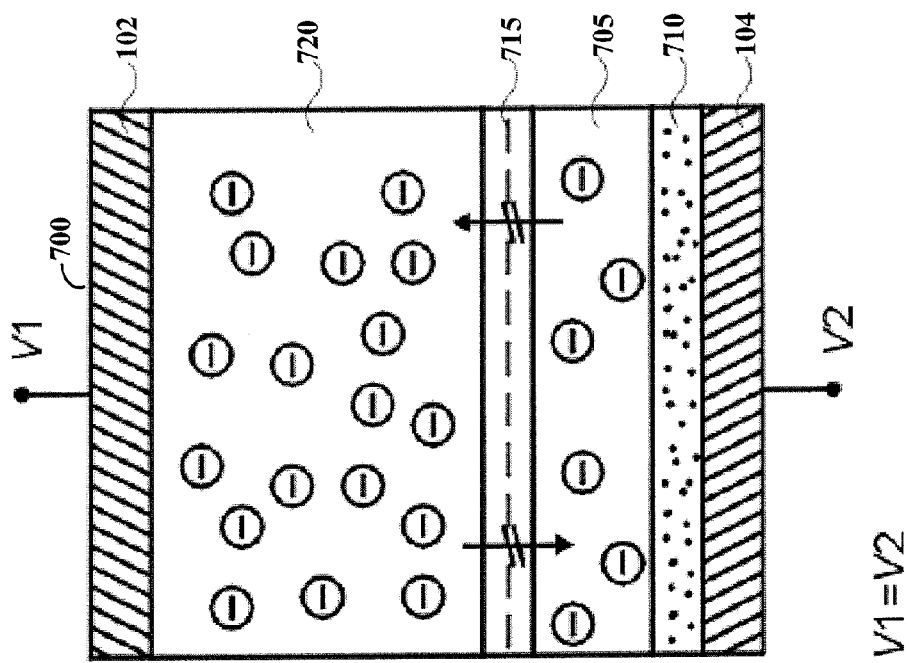
FIG. 7A depicts a block diagram of a different structure of an electrochemical memory cell, where the majority charge carrier in the reservoir are ions, according to an example embodiment of the present invention.

In another example embodiment, FIG. 7A depicts an electrochemical memory cell 700 with a modified control layer, wherein ions are the majority charge carrier. The control layer includes a mixed electronic ionic conductive layer 705 and a layer 710 which can be an electron conductor layer (or other layer/material) that inhibits the flow of ions onto the electrode (the layer 710 can also act as a diffusion barrier for ions, thereby preventing migration of ions through the electrode and a loss of ions in the reservoir). An internal barrier for ions 715 separates the solid state electrolyte in the reservoir 720 and the control layer. FIG. 7B depicts an electrochemical memory cell 750 with a modified control layer which is the same as memory cell 700, except that ion vacancies are the majority charge carrier. This is particularly suited for increasing the memory performance (e.g., speed and power requirements). As specific examples, the memory performance can be modified or increased by implementing larger resistor on/off ratios or otherwise tailoring the resistor on/off ratios.

A specific implementation includes combinations of an ion reservoir and an ion vacancy control layer or an ion vacancy reservoir and an ion conductive control layer.

In a further example embodiment, tailoring the internal barrier facilitates adjustment of the operation voltage and of the on and off resistance. In a specific implementation, the internal barrier is implemented using a dipole layer. FIG. 8A depicts an electrochemical memory cell 800, where the internal barrier is a dipole layer and ion vacancies are the majority charge carrier. An internal dipole barrier layer 805 for ion vacancies separates the solid state electrolyte in a reservoir 810 and a control layer 815. The configuration of FIG. 8A is chosen when the electrochemical potential of ions/ion vacancies in the reservoir is higher than the control layer.

Figure 8B:
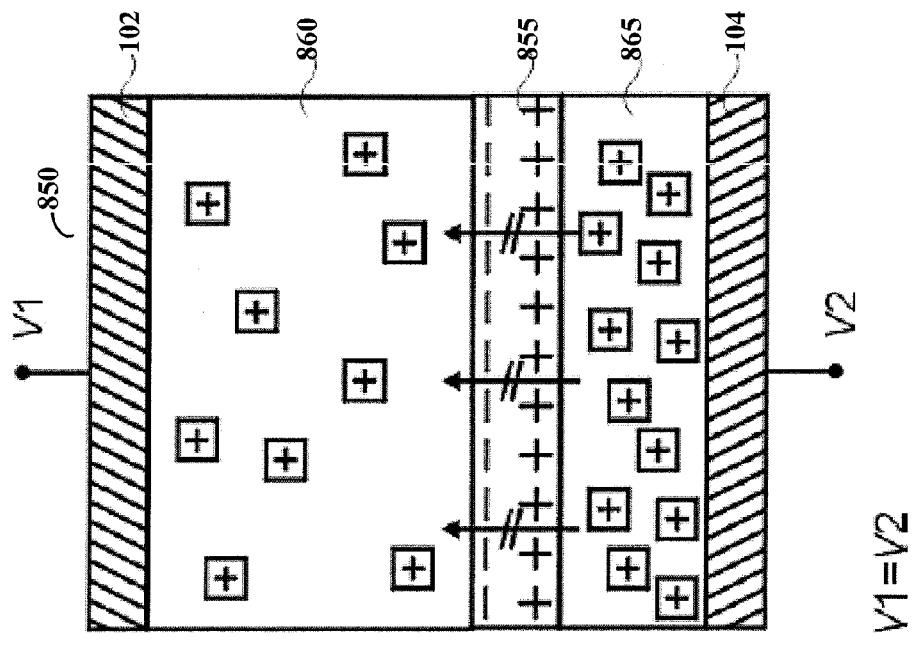
FIG. 8B depicts a block diagram of an electrochemical memory cell, where the internal barrier is realized by a dipole layer and the electrochemical potential of ion vacancies in the control layer is higher, according to an example embodiment of the present invention.
Figure 8A:
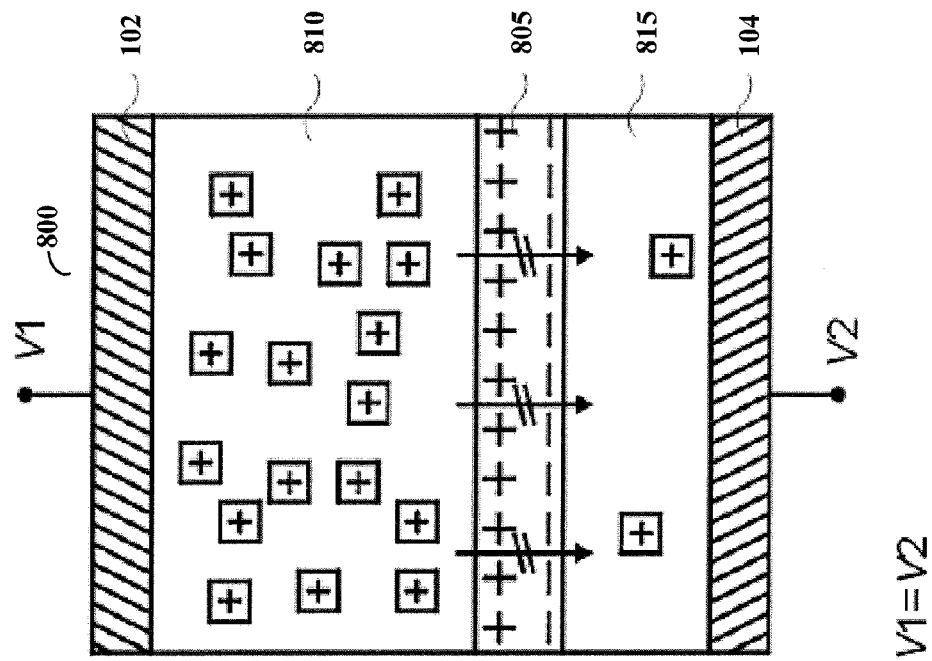
FIG. 8A depicts a block diagram of an electrochemical memory cell, where the internal barrier is realized by a dipole layer and the electrochemical potential of ion vacancies in the reservoir is higher, according to an example embodiment of the present invention.
Figure 9A:
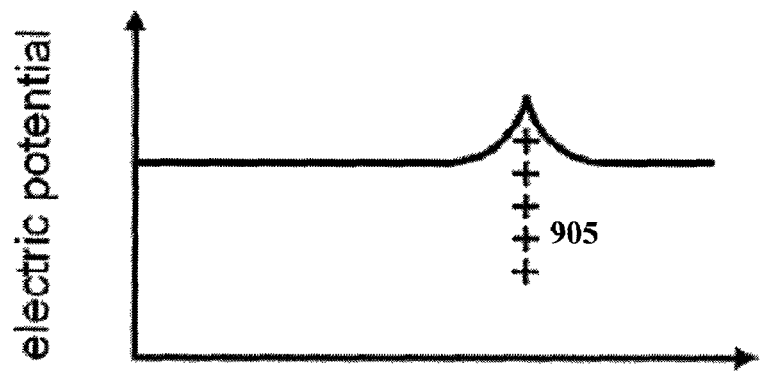
FIGS. 9A-C depict sketches of different examples of an inner electric barrier.
Figure 9B:
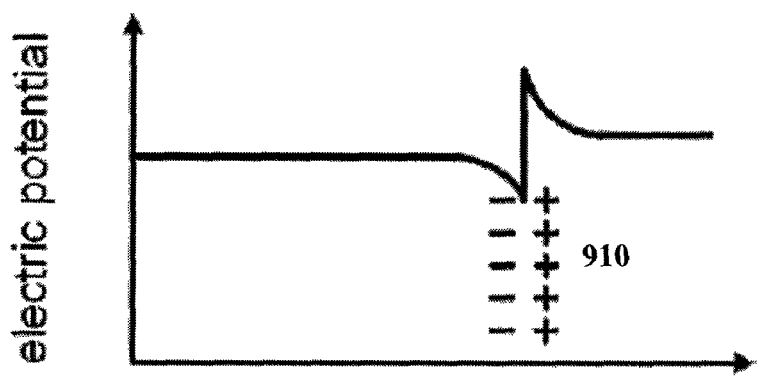
Figure 9C:
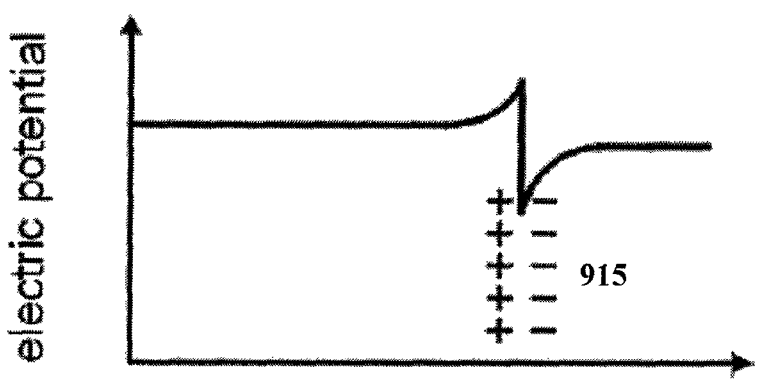

FIG. 8B also depicts an electrochemical memory cell 850, where the internal barrier is implemented using a dipole layer and ion vacancies are the majority charge carrier. An internal dipole barrier layer 855 for ion vacancies separates the solid state electrolyte in a reservoir 860 and a control layer 865. The configuration of FIG. 8B is chosen if the electrochemical potential of ions/ion vacancies in the control layer is higher than the reservoir. FIGS. 9A-C depict different realizations of the internal barrier layer. FIG. 9A shows a Coulomb barrier 905, and FIG. 9B and FIG. 9C show different versions of a dipole barrier 910 and 915.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For example, the reservoirs can be constructed using ionic reservoirs not typically associated with memory cells, such as various ionic battery arrangements and other arrangements, such as oxygen conductor arrangements. Such modifications and changes do not depart from the true spirit and scope of the present invention.

What is claimed is:

1. A memory element, comprising:
a first ionic reservoir having majority of ions of a first polarity;
a second ionic reservoir having majority of ions of the first polarity;
an ionic barrier, located between the first and second ionic reservoirs, having a charge of the first polarity and diminishing movement of ions between the reservoirs and,
in response to an absolute voltage differential across the barrier, facilitating movement of ions between the first and second ionic reservoirs.

2. The memory element of claim 1, wherein the barrier allows a charge of a second polarity to pass between the first and second ionic reservoirs in response to another absolute voltage differential across the barrier that is less than said absolute voltage differential across the barrier.

3. The memory element of claim 1, wherein a resistive value of the second ionic reservoir is responsive to ions moving between the first and second reservoir.

4. The memory element of claim 3, wherein the ionic barrier has an absolute electrical potential that is greater than the absolute potential of either the first and second ionic reservoirs when there is no voltage differential across the barrier.

5. The memory element of claim 1, wherein the ionic barrier has an absolute electrical potential that is greater than the absolute potential of either the first and second ionic reservoirs, the absolute electrical potential of the ionic barrier inhibiting ions from flowing when there is no voltage differential across the barrier and allowing ions to pass between the first and second ionic reservoirs if the absolute voltage differential across the barrier approaches or exceeds the absolute potential of the ionic barrier.

6. The memory element of claim 1, wherein the ionic barrier includes an electrically conductive material doped to produce the charge in the first polarity.

7. The memory element of claim 5, wherein the absolute electrical potential of the ionic barrier is generated by an interface effect due to charged trap states.

8. The memory element of claim 5, wherein the absolute electrical potential of the ionic barrier is generated by a heterojunction.

9. The memory element of claim 1, where the ionic barrier further includes a dipole created by a portion of the ionic barrier having a charge opposite of the first polarity.

10. The memory element of claim 1, wherein one of the reservoirs includes a layer that does not conduct ions.

11. The memory element of claim 1, wherein one of the reservoirs includes a tunnel barrier.

12. A memory element, comprising:
first means for holding a majority of ions of a first polarity;
second means for holding a majority of ions of the first polarity;
barrier means, located between the first and second means, having a charge of the first polarity and for controlling movement of ions between the first and second means in response to at least one voltage differential across the barrier.

13. A memory cell having two sections with outwardly-facing portions, the outwardly-facing portions electrically coupled to electrodes, the memory cell comprising:
an ionic barrier between the two sections, the two sections and the ionic barrier to facilitate movement of ions from one of the two sections to the other of the two sections in response to a first voltage differential across the outwardly-facing portions, and the two sections and the ionic barrier to diminish movement of ions from the one of the two sections to the other of the two sections in response to another voltage differential across the outwardly-facing portions.

* * * * *